United States Patent
Ohshima et al.

(10) Patent No.: US 6,260,128 B1
(45) Date of Patent: *Jul. 10, 2001

(54) SEMICONDUCTOR MEMORY DEVICE WHICH OPERATES IN SYNCHRONISM WITH A CLOCK SIGNAL

(75) Inventors: Shigeo Ohshima, Yokohama (JP); Shinji Miyamoto, Burlington, VT (US)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/132,438

(22) Filed: Aug. 11, 1998

(30) Foreign Application Priority Data

Aug. 13, 1997 (JP) ...................................... 9-218604

(51) Int. Cl.[7] ....................................... G11C 8/00
(52) U.S. Cl. ......................... 711/169; 711/167; 711/169; 713/401; 713/500; 365/233; 365/194
(58) Field of Search .................................. 711/167, 169; 713/500, 401; 365/233, 194

(56) References Cited

U.S. PATENT DOCUMENTS 5,802,596 * 9/1998 Shinozaki .............................. 711/169
5,815,462 * 9/1998 Konishi et al. ....................... 365/233
5,835,956 * 11/1998 Park et al. ............................ 711/167

OTHER PUBLICATIONS

"250MByte/Synchronous DRAM Using a 3-stage Pipelined Architecture," IEEE Journal of Solid-State Circuits, vol. 29, No. 4, Apr. 1994, by Yasuhiro Takai, et al., pp. 426-430.*

Takai, Y., M. Nagase, M. Kitamura, Y. Koshikawa, N. Yoshida, Y. Kobayashi, T. Obara, Y. Fukuzo, and H. Watanabe, "250Mbyte/sec Synchronous DRAM Using a 3-Stage-Pipelined Architecture," 1993, VLSI Circuits, Symposium. pp. 59-60.

* cited by examiner

*Primary Examiner*—Do Hyun Yoo
*Assistant Examiner*—Mehdi Namazi
(74) *Attorney, Agent, or Firm*—Hogan & Hartson L.L.P.

(57) ABSTRACT

A clock signal is supplied to an input buffer circuit. A delay circuit has a delay time equal to a difference between the cycle time for latency (CL) of 3 and the cycle time for latency of 2. When CL=2, a transfer gate outputs a clock signal delayed by the delay circuit, as a clock signal CLK2. The clock signal CLK2 initiates the operation in the second stage at the latency of 3. The operation at the latency of 2 can, therefore, be performed in a cycle time having a sufficient margin, without increasing the speed of the operation in the second stage at the latency of 3.

8 Claims, 7 Drawing Sheets

SEMICONDUCTOR MEMORY DEVICE WHICH OPERATES IN SYNCHRONISM WITH A CLOCK SIGNAL

BACKGROUND OF THE INVENTION

The present invention relates to a semiconductor memory device, such as a synchronous DRAM (Dynamic Random-Access Memory), which operates in synchronism with a clock signal.

Recently, synchronous DRAMs have been developed which can access data at high speed as the conventional SRAM (Static Random-Access Memory), thereby to provide high data-band width (i.e., the number of data bytes per unit time). Hitherto, 16M-bit synchronous DRAMs and 64M-bit synchronous DRAMs have been put to practical use. The greatest advantage of a synchronous DRAM resides in that data can be read from a synchronous DRAM at a higher bit per second, referred to as "Band width", than from the ordinary DRAM. More precisely, the data latched to any bit line controlled by the column-system circuit of the memory cell array can be output to an input/output (I/O) pins within a shorter column cycle time than in the ordinary DRAM. In other words, the column cycle time (tck) is shorter than in the ordinary DRAM.

A synchronous DRAM operates in synchronism with the leading edge of the clock signal supplied to the clock-signal input pin. In this respect the synchronous DRAM greatly differs from the conventional DRAM.

FIG. 12 shows pipeline architecture, which is the circuit design most commonly used to reduce the above-mentioned column cycle time (tck). This is a data-path architecture having three stages provided by dividing a data path by the clock cycle. Any one of these stages overlaps another in the same cycle. In the first stage, a column address is designated and a column access is determined. In the second stage, a data-line pair is selected among the data-line pairs provided in the memory cell array, and data is amplified so that it may be read out. In the third stage, the data amplified is read to the input/output pins.

In response to the first address A0 in the memory cell array, the pipeline architecture outputs data item DQ0 designated by the first address A0 and also data items DQ1, DQ2 and DQ3 that follow the item DQ0, one after another, at high speed. This high-speed data access is generally known as "burst reading."

A synchronous DRAM is characterized in that the Column latency (CL) can be changed by means of mode-setting. The latency is the number of clock pulses which define the time between the clock cycle in which a read command is given and the clock cycle in which the data to read is acquired. The latency is decreased in a system wherein the cycle of the clock signal cannot be shortened so much. Conversely, the latency is increased in a system to which a high-speed clock signal can be supplied. Usually, CL=2 in the system wherein the cycle of the first-mentioned system, and CL=3 in the second-mentioned system. In general, the cycle time tCK is inversely proportional to the latency. The shortest cycle time is 1/100 MHz (=10 ns) in a synchronous DRAM in which CL=3 and to which a 100 MHz clock signal is supplied, and is 1/(100*2/3) (=15 ns) in a synchronous DRAM in which CL2 and to which a 100 MHz clock signal is supplied.

FIG. 13 shows a conventional pipeline architecture that meets the specification described above. The same time lapses from the inputting of a column address in a synchronous DRAM to the outputting of the data to the input/output pins as in the conventional DRAM. The time is, for example, 30 ns. In the pipeline architecture of FIG. 13, the data bus is divided into two stages if CL=2 and into three stages if CL=3. In the conventional DRAM the data path for transferring the data latched in the memory cell array to the input/output pins cannot be divided so freely as is possible in a microprocessor unit (MPU). This is why the data path is divided into three stages in most cases, as is illustrated in FIG. 12. Obviously, the conventional pipeline architecture can meet the specification of CL=3 if the data path is divided into three stages ST1, ST2 and ST3 as shown in FIG. 13. The first stage ST1 includes an address latch circuit 130a and a column decoder 130b. The second stage ST2 includes a transfer gate 130c, a latch circuit 130d, a data line 130e, and a read amplifier 130f. The third stage ST3 includes an output latch circuit 130g and an output drive circuit 130h. The address latch circuit 130a is driven by a clock signal CLK1. The transfer gate 130c is driven by a clock signal CLK2. The data line 130e is connected to the bit lines of the memory cell array (not shown). The output latch circuit 130g is driven by a clock signal CLK3.

When the pipeline architecture of FIG. 13 is set in the mode of CL=2, it is necessary to short-circuit either the first and second stages or the second stage and third stages, thereby to reduce the number of stages to two. Generally, the second stage of the data bus of a DRAM is used for a long time to read data from the memory cell array, amplify the data thus read, and transfer the data to the input/output circuit. It is used longer than any other stage of the data bus and therefore has a small margin of cycle time. Hence, to switch the latency (CL) from 3 to 2, the power supply voltage Vcc is applied to the transfer gate 130c, instead of supplying the clock signal CLK2 thereto. As long as the voltage Vcc drives the transfer gate 130c, it connects the first stage ST1 and the second stage ST2. This stage-connecting method is most popular for the conventional pipeline architecture, because it defines the most simple circuit structure.

However, the operating time available for each stage of the data path is, of course, limited to the cycle time tCK. In the case of a DRAM whose clock-signal frequency is 100 MHz, the operating time of each stage is 10 ns if the latency (CL) is 3, and the stage defined by short-circuiting the first stage ST1 and the second stage ST2 requires an operating time of at most 20 ns (=10 ns+10 ns). If the latency (CL) is 2, each stage must be operated within 15 ns as may be understood from FIG. 13. Hence, with the conventional pipeline architecture it is necessary to drive each stage at a sufficiently high speed when the latency (CL) is 3, so that each stage within 15 ns may operate well when the latency (CL) is set at 2. From a viewpoint of circuit designing, however, it is difficult to drive each stage at a sufficiently high speed when the latency (CL) is 3.

BRIEF SUMMARY OF THE INVENTION

In view of the foregoing the present invention has been made. The object of the invention is to provide a semiconductor memory device which can operate with a sufficient margin of cycle time even if the latency is decreased.

The object is attained by a semiconductor memory device which has a data path divided into a plurality of stages, each having a pipeline structure and designed to operate in synchronism with a clock signal, and which comprises: a signal generating circuit for generating a first signal representing a first latency and a second signal representing a second latency in response to a command; a buffer circuit for receiving a clock signal; and a clock signal generating circuit connected to an output terminal of the buffer circuit, for generating an internal clock signal which drives the stages in response to the clock signal, and for changing a time between a leading edge of the clock signal and the generation of the internal clock signal in accordance with the first and second signals supplied from the signal generating circuit.

When the latency is decreased, the clock signal is delayed, shifting the phase of the clock signal. The clock signal with its phase thus shifted is supplied to a prescribed stage. The semiconductor memory device can therefore operate with a sufficient margin of cycle time even if the latency is decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the invention will be described, with reference to the accompanying drawings.

Figure 4:
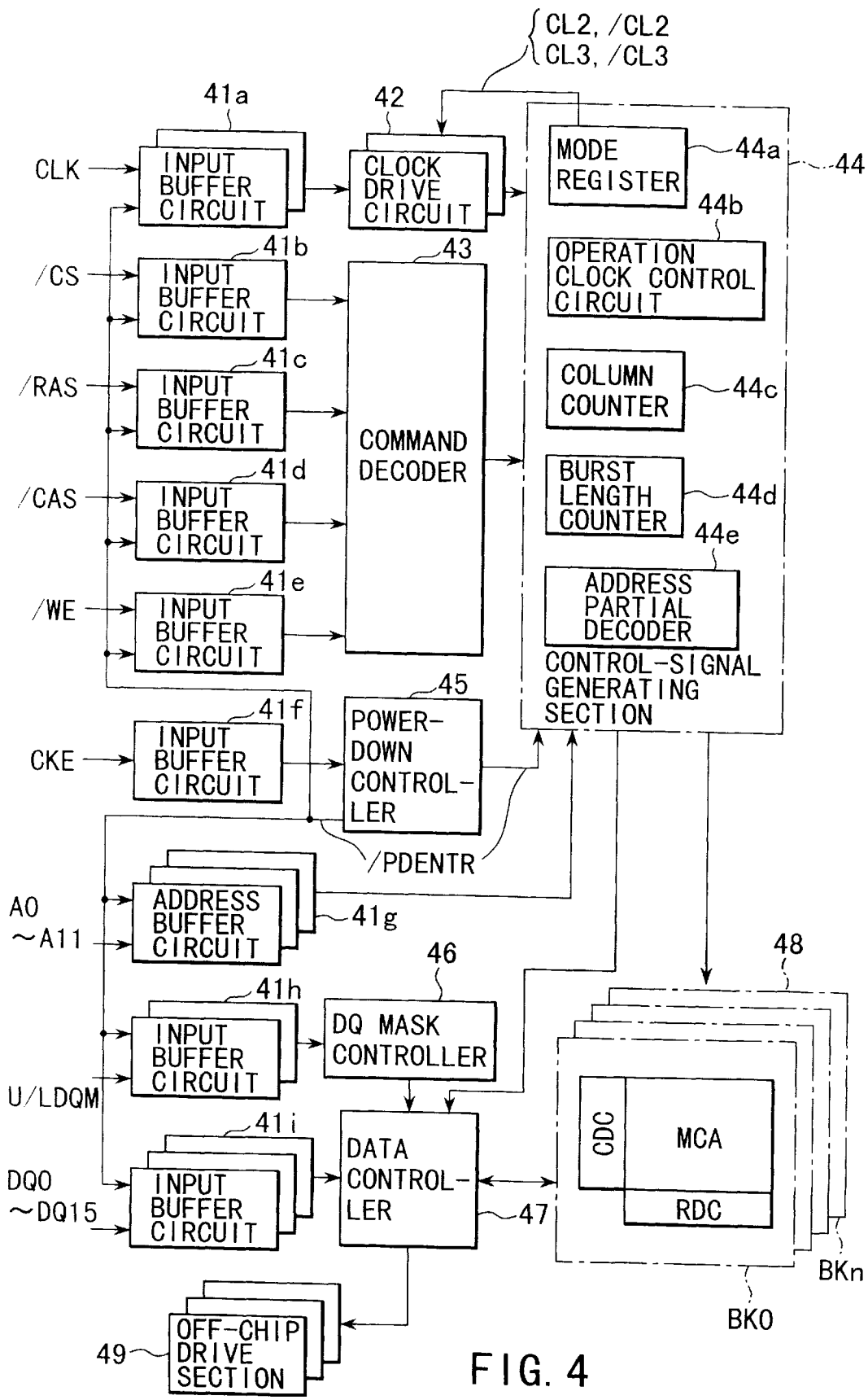
FIG. 4 is a block diagram of a semiconductor memory device to which the present invention is applied.

FIG. 4 shows a semiconductor memory device to which the present invention is applied. As shown in FIG. 4, a clock signal CLK, a chip select signal /CS, a row-address strobe signal /RAS, a column-address strobe signal /CAS and a write enable signal /WE are supplied to external connection pins (not shown), respectively. The clock signal CLK is supplied to a plurality of input buffer circuits 41a. The chip select signals /CS is supplied to an input buffer circuits 41b. The row-address strobe signal /RAS is supplied to an input buffer circuit 41c. The column-address strobe signal /CAS is supplied to an input buffer circuit 41d. The write enable signal /WE is supplied to an input buffer circuit 41e.

The clock signals CLK output from the input buffer circuits 41a are supplied to a plurality of clock drive circuits 42, respectively. The clock drive circuits generates clock signals CLK1, CLK2 and CLK3 (not shown in FIG. 4) in accordance with a latency signal supplied from a mode register (later described). The clock signal CLK1, CLK2 or CLK3 thus generated is supplied to a control-signal generating section 44 and some other circuits. The chip select signal /CS, row-address strobe signal /RAS, column-address strobe signal /CAS and write enable signal /WE are supplied to a command decoder 43. The command decoder 43 generates a read command, a write command, a latency-changing command and the like from, for example, the row-address strobe signal /RAS and column-address strobe signal /CAS. The commands are supplied to the control-signal generating section 44.

A clock enable signal CKE is supplied through an input buffer circuit 41f to a power-down controller 45. The power-down controller 45 generates a power-down signal /PDENTR in response to the clock enable signal CKE. The power-down signal /PDENTR is supplied to the input buffer circuits 41a to 42e, the control-signal generating section 44, address buffer circuits 41g, input buffer circuits 41h and input buffer circuits 41i. The power-down signal /PDENTR disables the circuits 41a to 41e, the input buffer circuits 41g to 41i and the control-signal generating section 44, thereby to save electric power.

Address signals A0 to A11 are supplied via the address buffer circuits 41g to the control-signal generating section 44. The control-signal generating section 44 has a mode register 44a, an operation clock control circuit 44b, a column counter 44c, a burst length counter 44d, an address partial decoder 44e and a refresh circuit (not shown).

The mode register 44a stores data for controlling the latency and data for controlling the burst length. The register 44a receives a latency-changing command from the command decoder 43 and generates a signal CL2, a signal /CL2, a signal CL3 and a signal /CL3 in response to the latency-changing command. The signals CL2, /CL2, CL3 and /CL3 are supplied to the clock drive circuits 42. The operation clock control circuit 44b receives the clock signals from the clock drive circuits 42 and controls the timing of operating column decoders, the timing of selecting the column-selecting lines, and the timing of operating a DQ buffer (not shown) holding read data and write data. The column counter 44c counts column addresses for achieving burst reading. The burst length counter 44d counts burst lengths in order to achieve burst reading. The address partial decoder 44e decodes a part of a column address and a part of a row address. The output of the address partial decoder 44e is supplied to a memory block 48. The memory block 48 has a plurality of banks BK0 to BKn. Each bank has a memory cell array MCA, a column decoder CDC and a row decoder RDC. The memory cell array MCA comprises a plurality of memory cells arranged in rows and columns. The column decoder CDC and the row decoder RC cooperate to select at least one of the memory cells.

A signal U/LDQM for masking the inputting and outputting of data is supplied via the input buffer circuits 41h to a DQ mask controller 46. Data items DQ0 to DQ15 input to the external connection pins (not shown) are supplied through the input buffer circuits 41i to a data controller 47. The data controller 47 supplies the data DQ0 to DQ15 to the memory block 48 in accordance with the output of the DQ mask controller 46. The data DQ0 to DQ15 are thereby written into the memory block 48. The data controller 47 amplifies data read from the block memory 48. The data thus amplified is supplied to a plurality of off-chip drive section 49. The off-chip drive sections 49 output data to the external connection pins (not shown).

Figure 13:
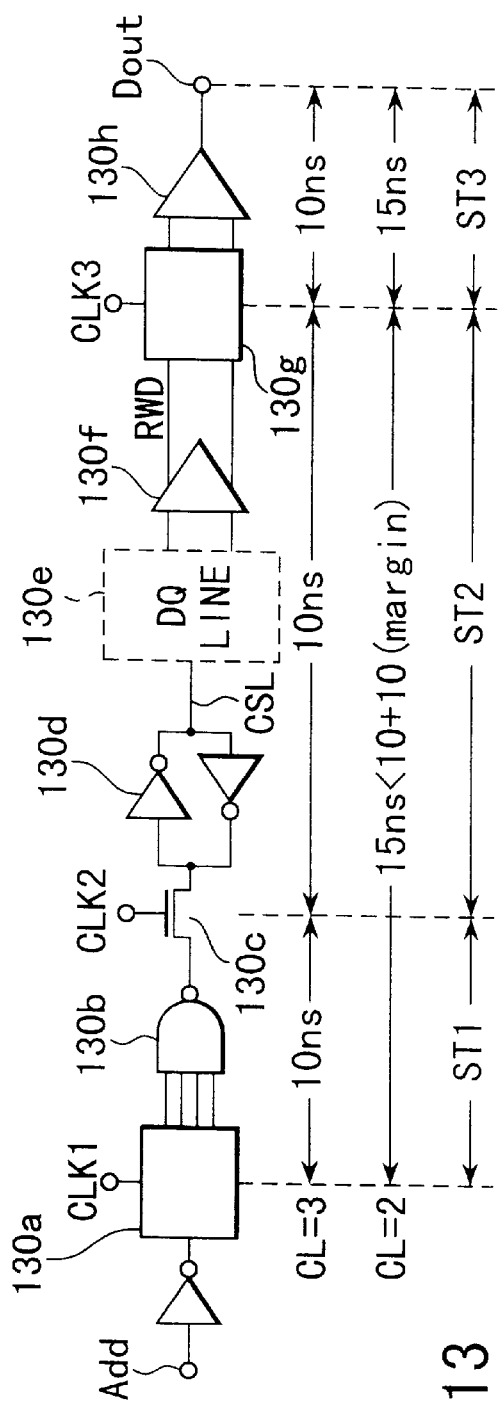
FIG. 13 is a diagram for explaining the latency control performed on a synchronous DRAM.

The clock signal CLK1 is supplied to a column-address system circuit, which constitutes the first stage of the pipeline, for example, the address partial decoder 44e or the like. The block signal CLK2 is supplied to, for example, a column selecting circuit (not shown) and an amplifier circuit. The column selecting circuit constitutes the second stage of the pipeline and is designed to select at least one data-line pair connected to memory cells. The amplifier circuit is provided to amplify data read from the memory cells. The clock signal CLK3 is supplied to, for example, one of the off-chip drive sections 49 which is a circuit for supplying data to external output pins (not shown). The pipeline architecture used in the memory device of FIG. 4 is almost identical to the pipeline architecture illustrated in FIG. 13. The component equivalent to the transfer gate 130c connecting the first and second stages shown in FIG. 13 is not shown in FIG. 4.

FIGS. 1, 2A, 2B and 3 show the first embodiment of the invention. In the first embodiment, a clock signal CLK2 is delayed, thus shifting the phase of the clock signal CLK2, when the latency (CL) is changed from 3 to 2. That is, the clock signal CLK2 is not replaced by a power supply voltage Vcc as in the conventional pipeline architecture when the latency is 2.

Figure 1:
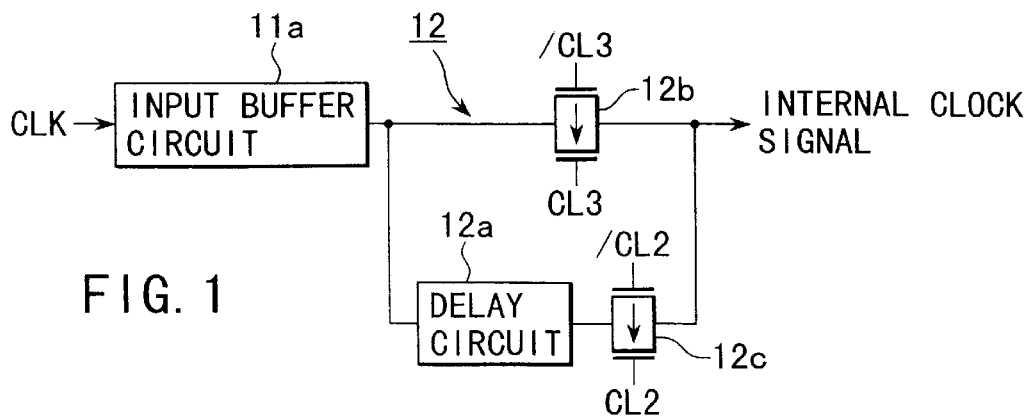
FIG. 1 is a block diagram showing a first embodiment of the invention.

FIG. 1 shows an input buffer circuit 11a and a clock drive circuit 12. The input buffer circuit 11a is one of the input buffer circuits 41a shown in FIG. 4. The clock drive circuit 12 is one of the clock drive circuits 42 illustrated in FIG. 4. As shown in FIG. 1, the clock drive circuit 12 comprises a delay circuit 12a and two transfer gates 12b and 12c. The transfer gate 12b comprises a p-channel MOS transistor (hereinafter referred to as "PMOS transistor") and an n-channel MOS transistor (hereinafter referred to as "NMOS transistor"). The transfer gate 12c comprises a PMOS transistor and an NMOS transistor. The input terminal of the transfer gate 12b is connected to the output terminal of the input buffer circuit 11a. The input terminal of the delay circuit 12a is connected to the output terminal of the input buffer circuit 11a. The output terminal of the delay circuit 12a is connected to the input terminal of the transfer gate 12c. The output terminal of the transfer gate 12c is connected to the output terminal of the transfer gate 12b.

When the latency (CL) is set at 3, the mode register 44a outputs signals /CL3 and CL3. The signals /CL3 and CL3 are respectively supplied to the gate of the PMOS transistor and the gate of the NMOS transistor, which constitute the transfer gate 12b. When the latency (CL) is set at 2, the mode register 44a outputs signals /CL2 and CL2. These signals /CL2 and CL2 are respectively supplied to the gate of the PMOS transistor and the gate of the NMOS transistor, which constitute the transfer gate 12c.

Figure 2A:
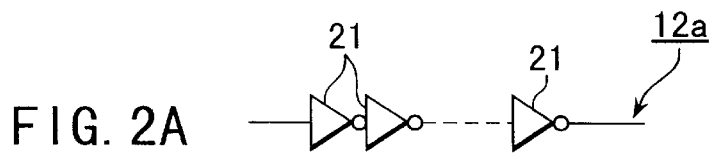
FIGS. 2A and 2B are circuit diagrams showing two alternative types of delay circuits, respectively, each for use in the first embodiment of the invention.
Figure 2B:
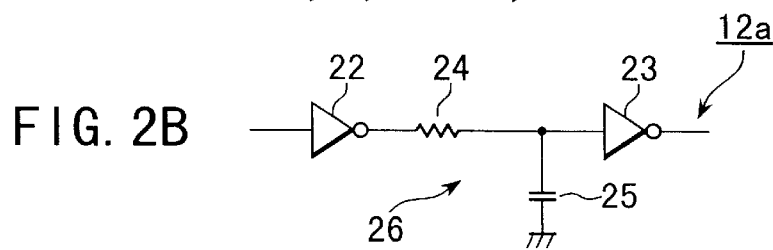

The delay circuit 12a may be the circuit shown in FIG. 2A or the circuit shown in FIG. 2B. The circuit of FIG. 2A comprises a plurality of inverter circuits 21 that are connected in series. The circuit of FIG. 2B comprises two inverter circuits 22 and 23, a resistor 24, and a capacitor 25. The resistor 24 is connected between the inverter circuits 22 and 23. The capacitor 25 is connected between an input terminal of the inverter circuit 23 and a ground. The delay circuit 12a is not limited to the types shown in FIGS. 2A and 2B. Rather, the circuit 12a can be modified in various ways.

Figure 3:
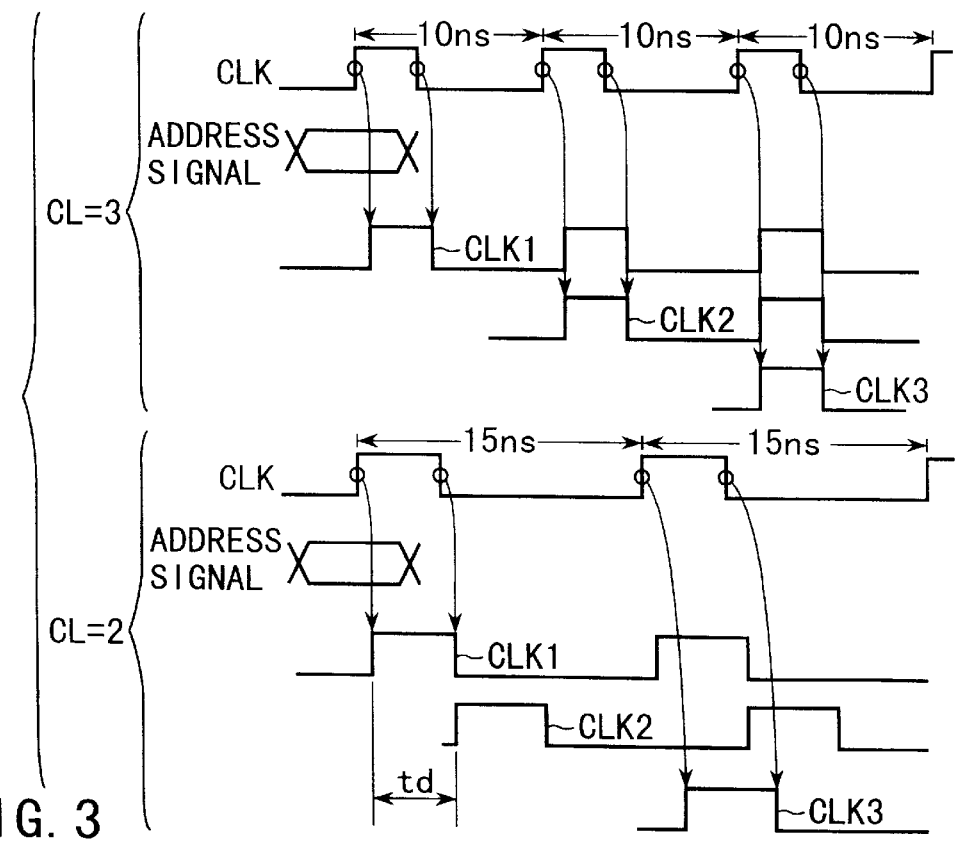
FIG. 3 is a timing chart for explaining the operation of the first embodiment.

The operation of the circuit shown in FIG. 1 will be described, with reference to the timing chart of FIG. 3.

When the latency (CL) is 3, the signals /CL3 and CL3 are active, whereas the signals /CL2 and CL2 are inactive. The transfer gates 12b and 12c are therefore on and off, respectively. When a clock signal is supplied to the input buffer circuit 11a in this condition, it is output via the transfer gate 12b as is illustrated in FIG. 3. The clock signal is supplied, as an internal clock signal CLK2, to the circuits constituting the second stage, the transfer gate 130c provided between the first and second stages shown in FIG. 13, and the like. Another internal clock signal CLK1 has been output via the input buffer circuit 41a and the clock drive circuit 42, prior to the internal clock signal CLK2.

When the latency (CL) is switched from 3 to 2, the signals /CL2 and CL2 becomes active, whereas the signals /CL3 and CL3 become inactive. Hence, the transfer gates 12b and 12c are turned off and on, respectively. The internal clock signal CLK1 has been output prior to the internal clock signal CLK2, at the same timing as in the case where the latency (CL) is 3.

When the clock signal CLK is supplied to the input buffer circuit 11a while the transfer gates 12b and 12c respectively remain off and on, the delay circuit 12a delays the clock signal CLK for a predetermined time. The clock signal CLK thus delayed is supplied through the transfer gate 12c to the circuits constituting the second stage, the transfer gate 130c provided between the first and second stages, and the like. The delay time of the delay circuit 12a is, for example, the time required for establishing the address supplied to the address buffer circuit 41g. More precisely, the delay time is at most 5 ns for a synchronous DRAM operating at 100 MHz. The value of 5 ns is the difference between the cycle time tCK of 15 ns at the latency (CL) of 2 and the cycle time tCK of 10 ns at the latency (CL) of 3. The minimum value for the delay time is determined by the time required to acquire a column address from an external device and latch the column address internally. In this case, data can be transferred to the next stage within the cycle time tCK at the latency (CL) of 2, which is at most 15 ns (=10 ns+delay time).

In the first embodiment, the delay circuit 12a delays the clock signal supplied from the external device until the address signal is established. The clock signal thus delayed is used in the second stage at the latency (CL) of 3. Therefore, the cycle time can have a sufficient margin even if the latency (CL) is 2, whereby the first embodiment can operate reliably.

Figure 5:
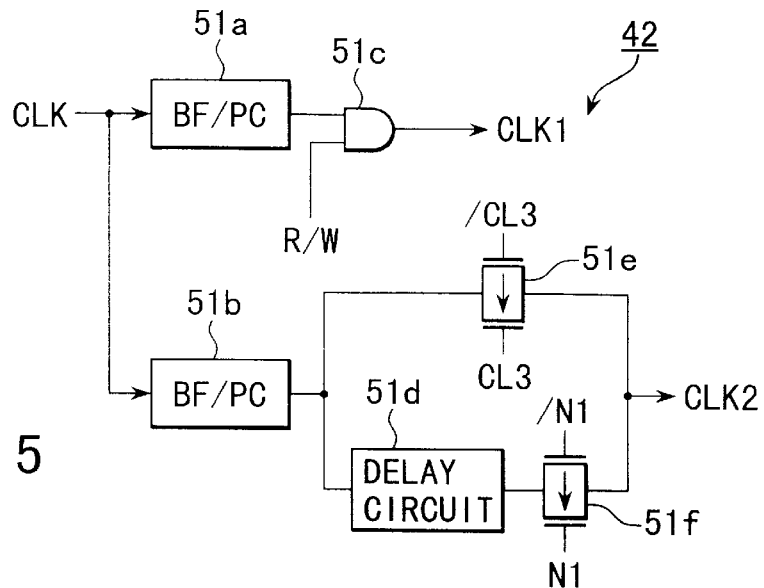
FIG. 5 is a block diagram showing a second embodiment of the invention.

FIGS. 5 to 8 show the second embodiment of the present invention. As shown in FIG. 5, a clock signal CLK is supplied to input buffer circuits (BF/PC) 51a and 51b, each including a pulse circuit. The clock signal output from the input buffer circuit 51a is supplied to an AND circuit 51c, along with a read/write command R/W generated by the command decoder 43. Controlled by the read/write command R/W, the AND circuit 51c outputs a clock signal CLK1.

The output terminal of the input buffer circuit 51b is connected to the input terminal of a transfer gate 51e and also to the input terminal of a delay circuit 51d. The delay time set in the delay circuit 51d is equal to the delay time set in the delay circuit 12a of the first embodiment. The output terminal of the delay circuit 51d is connected to the input terminal of the transfer gate 51f. The output terminal of the transfer gate 51f is connected to the output terminal of the transfer gate 51e. The transfer gate 51e comprises a PMOS transistor and an NMOS transistor. Another transfer gate 51f is provided, which comprises a PMOS transistor and an NMOS transistor. When the latency (CL) is 3, the mode register 44a generates signal /CL3 and CL3. The signals /CL3 and CL3 are supplied to the gates of the PMOS and NMOS transistors of the transfer gate 51e, respectively. Signals N1 and N2 are supplied to the gates of the PMOS and NMOS transistors of the transfer gate 51f, respectively.

Figure 6:
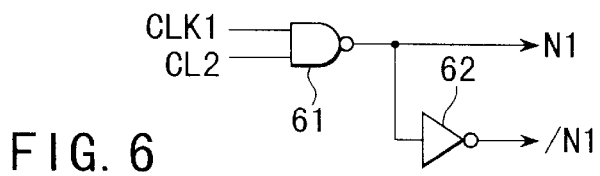
FIG. 6 is a circuit diagram of a signal-generating circuit for use in the second embodiment.

The signals N1 and N2 have been generated by a circuit shown in FIG. 6. As shown in FIG. 6, this circuit comprises a NAND circuit 61 and an inverter circuit 62. The NAND circuit 61 generates the signal N1 upon receiving at its first input the clock signal CLK1 output from the AND circuit 51c and at its second input the signal CL2 the mode register 44a generates when the latency (CL) is set at 2. The inverter circuit 62 inverts the signal N1, generating the signal /N1.

Figure 7:
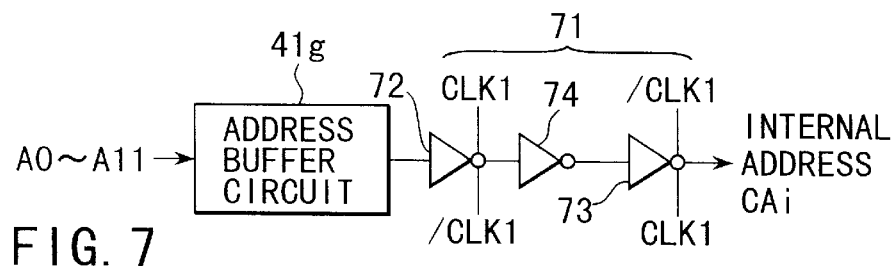
FIG. 7 is a circuit diagram of a circuit for receiving signals generated by the circuit shown in FIG. 5.

FIG. 7 illustrates an address buffer circuit 41g. The output terminal of the address buffer circuit 41g is connected to a transfer gate 71. The transfer gate 71 comprises clocked inverter circuits 72 and 73 and an inverter circuit 74, which are connected in series. The clocked inverters 72 and 73 are controlled by the clock signal CLK1 and the signal /CLK1 obtained by inverting the clock signal CLK1. The transfer gate 71 generates an internal address CAi.

Figure 8:
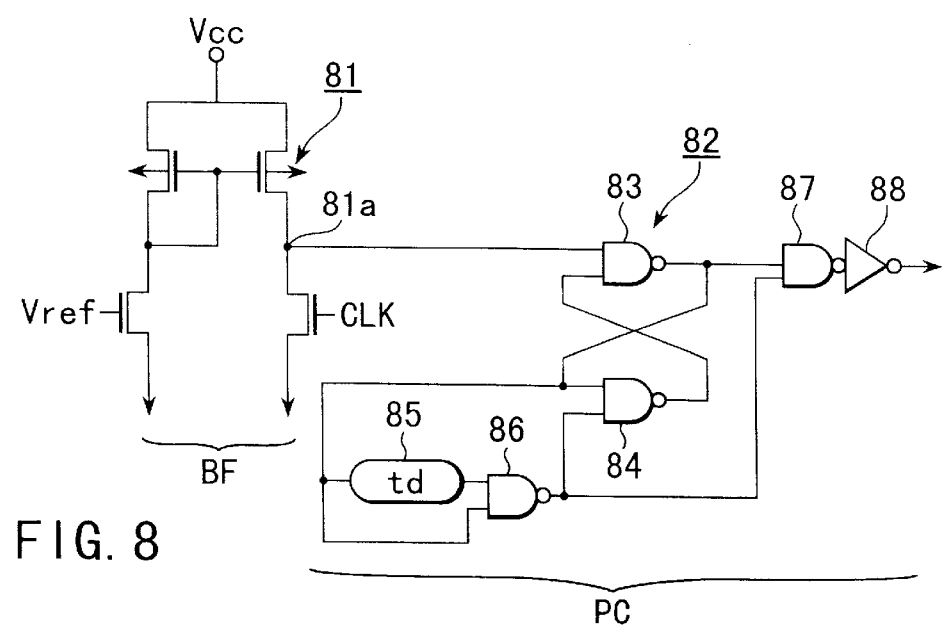
FIG. 8 is a circuit diagram of an input buffer circuit for use in the second embodiment.

The input buffer circuits 51a and 51b have the same structure that is shown in FIG. 8. Each input buffer circuit comprises an input buffer circuit BF and a pulse circuit PC connected to the output terminal of the circuit BF. The input buffer circuit BF has a differential amplifier 81. A clock signal CLK is supplied to the gate of a NMOS transistor incorporated in the input buffer circuit BF. A reference voltage Vref is applied to the gate of the other NMOS transistor provided in the input buffer circuit BF. The pulse circuit PC comprises a flip-flop circuit 82, a delay circuit 85, a NAND circuit 86, a NAND circuit 87, and an inverter circuit 88. The flip-flop circuit 82 comprises NAND circuits 83 and 84. One input terminal of the NAND circuit 83 is connected to the output terminal 81a of the input buffer circuit BF. One input terminal of the NAND circuit 84 is connected to the input terminal of the delay circuit 85. The output terminal of the delay circuit 85 is connected to one input terminal of the NAND circuit 86. The other input terminal of the NAND circuit 86 is connected to one input terminal of the NAND circuit 85. The output terminal of the NAND circuit 86 is connected to the other input terminal of the NAND circuit 84 and also to the one input terminal of the NAND circuit 87. The output terminal of the NAND circuit 83 is connected to the other input terminal of the NAND circuit 87. The output terminal of the NAND circuit 87 is connected to the inverter circuit 88.

The operation of the second embodiment will be explained with reference to the timing chart of FIG. 9.

The second embodiment operates in the same way as the first embodiment when the latency (CL) is 3. Therefore, it will not be described how the second embodiment operates when CL=3.

Figure 9:
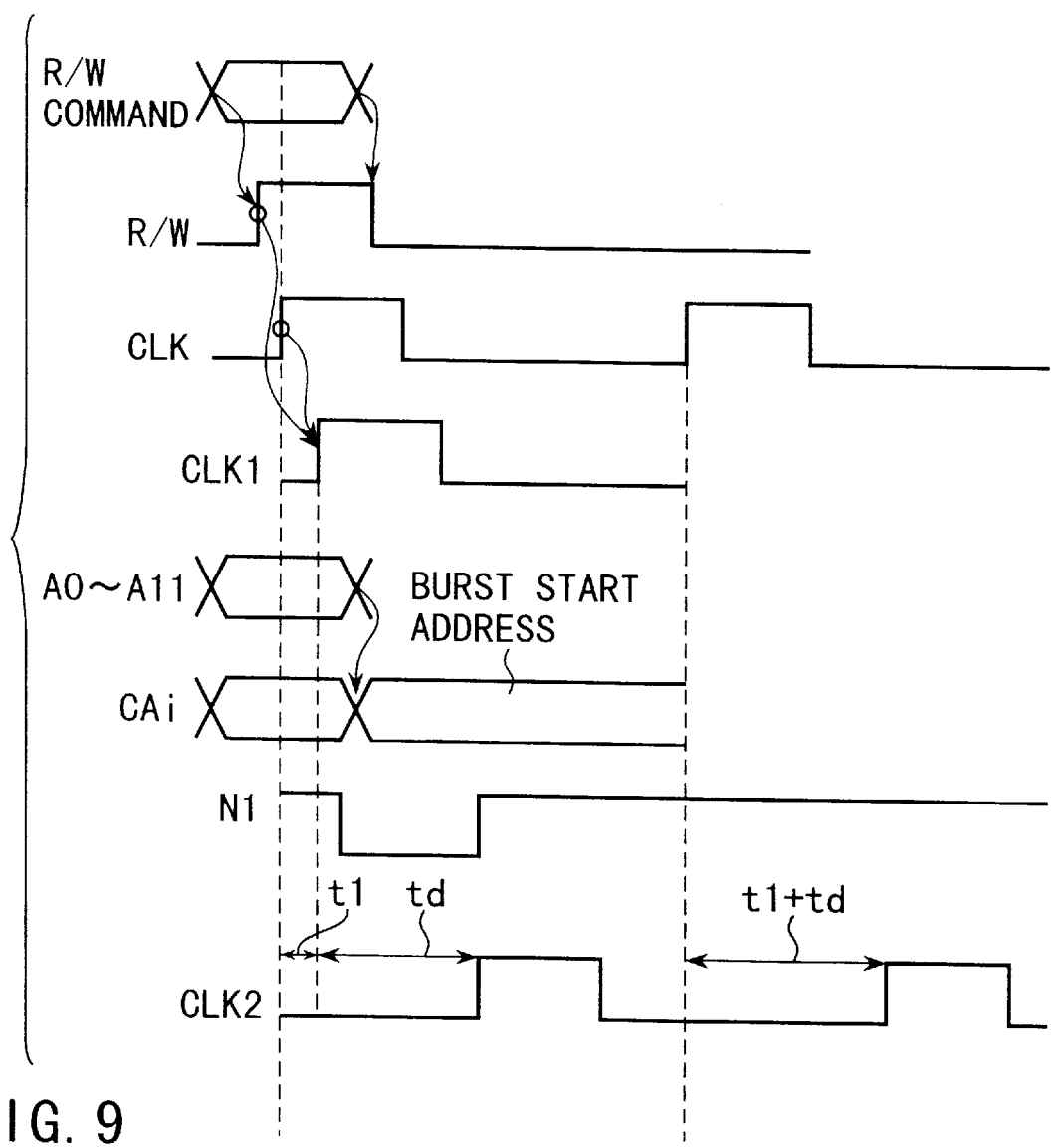
FIG. 9 is a timing chart for explaining the operation of the second embodiment.

As shown in FIG. 9, the command decoder 43 output a read/write command R/W in response to a row-address strobe signal /RAS and a column-address strobe signal /CAS. The input buffer circuit 51a receives the clock signal CLK and outputs a clock signal. This clock signal CLK1 is output from the AND circuit 51c as clock signal CLK1 when the AND circuit 51c receives the read/write command R/W. The clock signal CLK1 is delayed with respect to the clock signal CLK by, for example, time t1. The time t1 is the operating time of the input buffer circuit 51a, NAND circuit 51c and the like. It is impossible to reduce the time t1 to nil. The clock signal CLK1 is supplied to the clocked inverter circuits 72 and 73. In accordance with the clock signal CLK1, the address signal is latched and established in the first stage of the pipeline.

The delay circuit 51d delays the clock signal supplied to the input buffer circuit 51b, by a predetermined time td. The clock signal is then supplied to the transfer gate 51f. The transfer gate 51f is controlled by the signals N1 and /N1 that are synchronous with the leading edge of the clock signal CLK1. Controlled by the signals N1 and /N1, the transfer gate 51f outputs the clock signal delayed that has been delayed by the delay circuit 51d. The clock signal output from the transfer gate 51f, or clock signal CLK2, is therefore delayed by time t1+td with respect to the clock signal CLK. The clock signal CLK2 initiates an operation in the second stage when the latency (CL) is 3. In other words, the clock signal CLK2 controls the circuits constituting the second stage and the transfer gate 130c (FIG. 13) that connects the first and second stages.

In the second embodiment, the delay circuit 51d and the transfer gate 51f cooperate, generating a clock signal CLK2, when the latency (CL) is 2. The clock signal CLK2 is delayed by the difference between the cycle time for CL of 2 and the cycle time for CL of 3. The clock signal CLK2 initiates the operation in the second stage when the latency is 3. Hence, the operation can be performed at CL of 2 in a cycle time having a sufficient margin, without increasing the speed of the operation at CL of 3 in the second stage of the pipeline.

As described above, the transfer gate 71 is connected to the output terminal of the address buffer circuit 41g and controlled by the clock signal CLK1 output from the AND circuit 51c. The transfer gate 51f is controlled by the signals N1 and /N1 generated from the clock signal CLK1 and the clock signal CLK2 representing the latency of 2. The internal address output from the transfer gate 71 can, therefore, be synchronized with the clock signal CLK2. This ensures reliable operation of the second embodiment.

The third embodiment of the present invention will now be described, with reference to FIG. 10.

Figure 10:
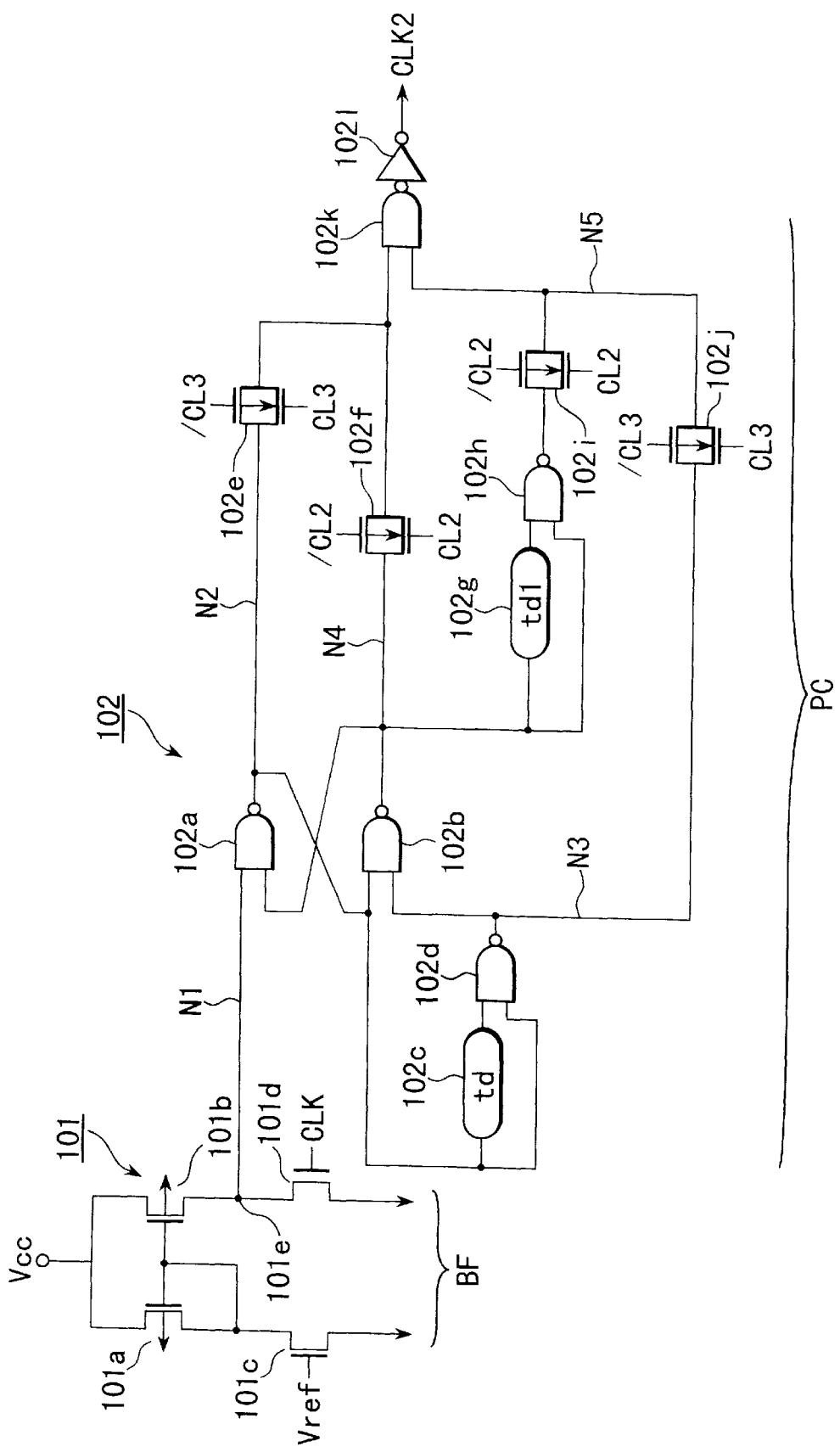
FIG. 10 is a circuit diagram of a third embodiment of the present invention.

As shown in FIG. 10, the third embodiment comprises an input buffer BF and a pulse circuit PC. The pulse circuit PC is connected to the output terminal of the input buffer BF. The input buffer BF comprises a differential amplifier 101. The amplifier 101 has PMOS transistors 101a and 101b and NMOS transistors 101c and 101d. A reference voltage Vref is applied to the gate of the NMOS transistor 101c. A clock signal CLK is supplied to the gate of the NMOS transistor 101d.

The pulse circuit PC comprises a flop-flop circuit 102, which in turn comprises two NAND circuits 102a and 102b. One input terminal of the NAND circuit 102a is connected to the output terminal 101e of the input buffer circuit 101. One input terminal of the NAND circuit 102b is connected to the input terminal of a delay circuit 102c. The output terminal of the delay circuit 102c is connected to one input terminal of a NAND circuit 102d. The other input terminal of the NAND circuit 102d is connected to the input terminal of the delay circuit 102c. The output terminal of the NAND circuit 102d is connected to the other input terminal of the NAND circuit 102b and also to the input terminal of a transfer gate 102j.

The output terminal of the NAND circuit 102a is connected to the input terminal of a transfer gate 102e. The output terminal of the NAND circuit 102b is connected to the input terminal of a transfer gate 102f. The output terminals of the transfer gates 102e and 102f are connected to one input terminal of a NAND circuit 102k. The output terminal of the NAND circuit 102b is connected to the input terminal of the delay circuit 102g. The output terminal of the delay circuit 102g is connected to one input terminal of a NAND circuit 102h. The other input terminal of the NAND circuit 102h is connected to the input terminal of the delay circuit 102g. The output terminal of the NAND circuit 102h is connected to a transfer gate 102i. The output terminal of the transfer gate 102i is connected to the output terminal of a transfer gate 102j and also the other input terminal of the NAND circuit 102k. The output terminal of the NAND circuit 102k is connected to the input terminal of an inverter circuit 102l.

The transfer gate 102e is driven by signals CL3 and /CL3 which represent the latency (CL) of 3. The transfer gate 102j is driven by the signals CL3 and /CL3. The transfer gate 102f is driven by signal CL2 and /CL2 which represent the latency (CL) of 2. The transfer gate 102i is driven also by signal CL2 and /CL2.

The delay time td set in the delay circuit 102c is equal to the delay time set in the above-mentioned delay circuits 12a and 51d. The delay time td1 set in the delay circuit 102g defines the pulse width of the clock signal CLK2 and is nearly equal to, for example, the delay time td.

Figure 11:
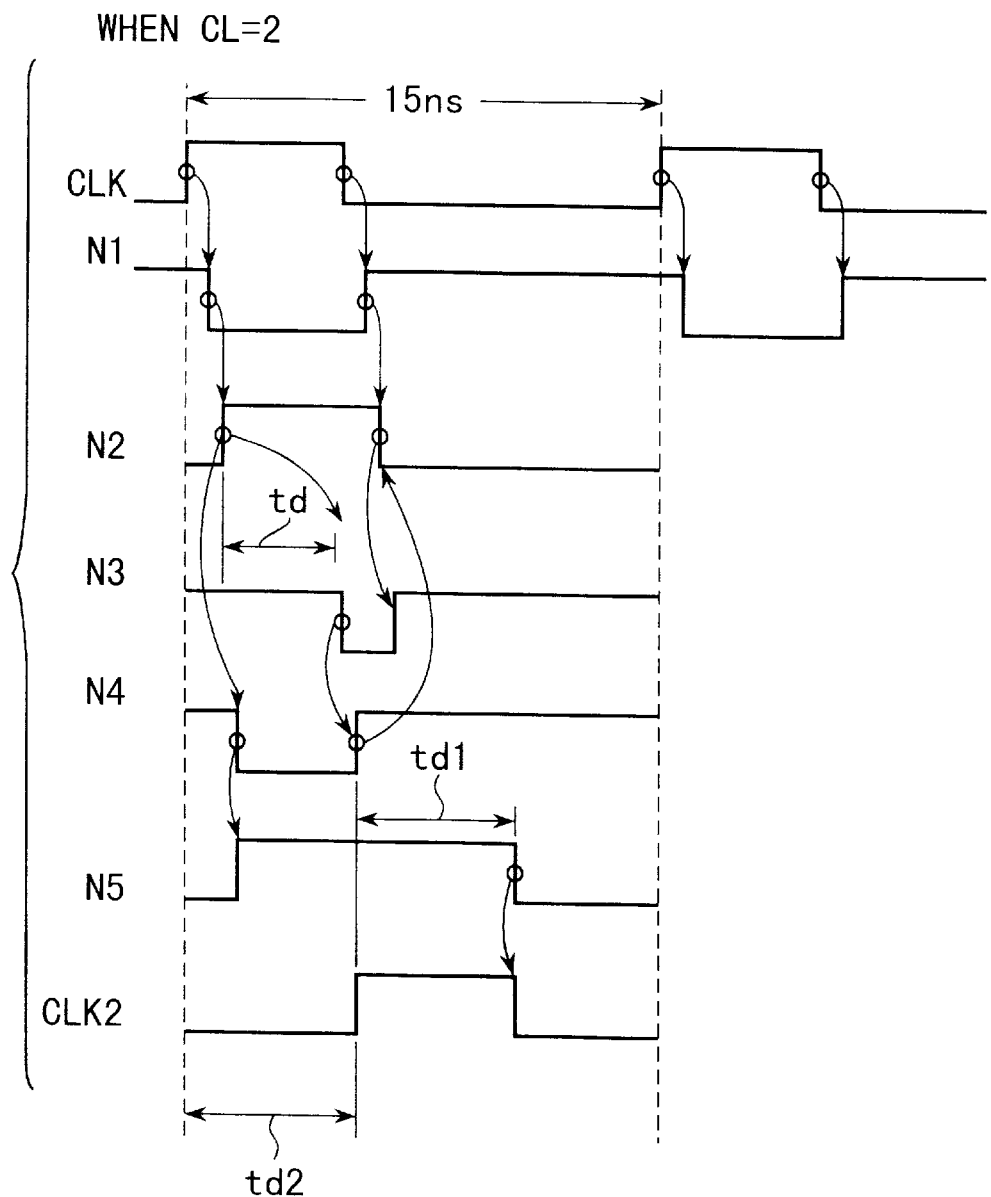
FIG. 11 is a timing chart for explaining the operation of the third embodiment.
Figure 12:
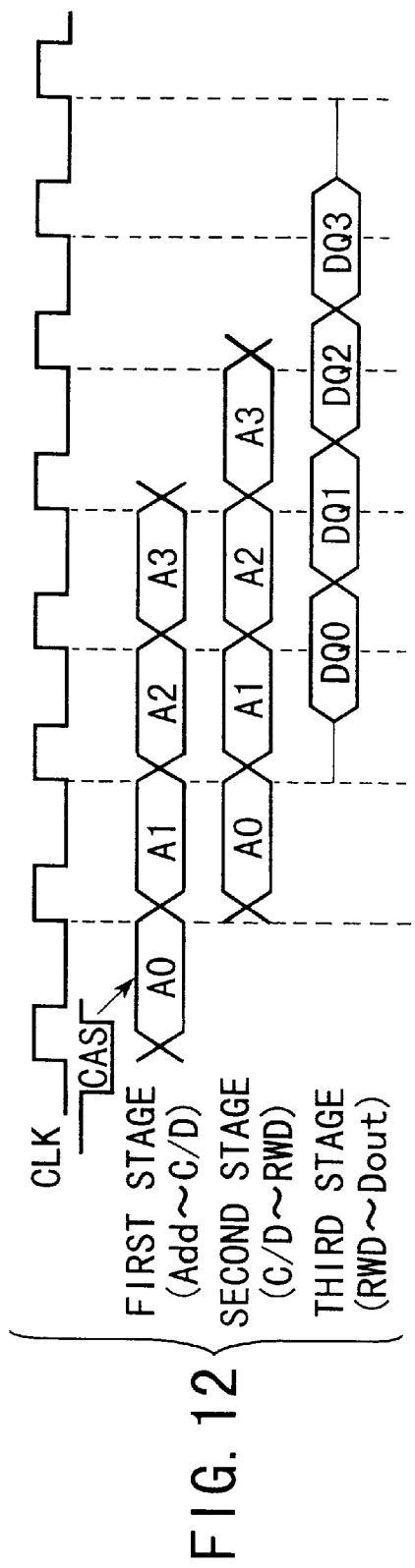
FIG. 12 is diagram for explaining the pipeline processing performed on a synchronous DRAM.

FIG. 11 is a timing chart for explaining the operation of the third embodiment shown in FIG. 10. When the latency (CL) is 3, the transfer gates 102f and 102i are off and the transfer gates 102e and 102j are on. In this case, the circuit of FIG. 10 is equivalent in structure to the circuit of FIG. 8 and operates in the same way as the circuit of FIG. 8.

When the latency (CL) is 2, the transfer gates 102f and 102i are on and the transfer gates 102e and 102j are off. In this condition, the output signal N1 of the input buffer circuit BF falls to the low level as the clock signal CLK is supplied to the input buffer circuit BF. The output signal N2 of the NAND circuit 102a incorporated in the flip-flop circuit 102 therefore rises to the high level. By contrast, the output signal N4 of the NAND circuit 102b incorporated in the flip-flop circuit 102 falls to the low level. As a result, the output signal N5 of the transfer gate 102i rises to the high level. The output signal N4 of the NAND circuit 102b rises to the high level when the delay time td of the delay circuit 102c elapses and the output signal N3 of the NAND circuit 102d therefore falls to the low level. As the signal N4 so rises, the inverter circuit 102l starts outputting a clock signal CLK2. The inverter circuit 102l stops outputting the clock signal CLK2 when the delay time tdl of the delay circuit 102g elapses and the output signal N5 of the transfer gate 102i therefore falls to the low level.

As a result, the clock signal CLK2 is generated upon lapse of the time td2 from the leading edge of the clock signal CLK. By virtue of the clock signal CLK2, the operation at CL of 3 can be performed in the second stage of the pipeline.

The third embodiment can achieve the same advantages as the first and second embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device having a data path divided into a plurality of stages, each having a pipeline structure and designed to operate in synchronism with a clock signal, said device comprising:

a signal generating circuit for generating a first signal representing a first latency and a second signal representing a second latency smaller than the first latency in response to a command;

a buffer circuit having an input terminal and an output terminal, for receiving a clock signal at the input terminal and outputting the clock signal from an output terminal;

a first transfer gate connected to the output terminal of the buffer circuit, for outputting the clock signal supplied from the buffer circuit as an internal clock signal in response to the first signal supplied from the signal generating circuit;

a delay circuit connected to the output terminal of the buffer circuit, for delaying the clock signal supplied from the buffer circuit; and a second transfer gate connected to an output terminal of the buffer circuit, for outputting the clock signal supplied from the delay circuit as the internal clock signal in response to the second signal supplied from the signal generating circuit, wherein said delay circuit has a delay time equal to the difference between a cycle time of the first latency and a cycle time of the second latency.

2. A semiconductor memory device having a data path divided into first, second and third stages, each having a pipeline structure and designed to operate in synchronism with a clock signal, said device comprising:

a signal generating circuit for generating, in response to a command, a first signal representing a first latency and a second signal representing a second latency smaller than the first latency;

a first buffer circuit for receiving a clock signal and outputting the clock signal;

a gate circuit connected to an output terminal of the first buffer circuit, for outputting the clock signal supplied from the first buffer circuit as a first clock signal in response to a command;

a second buffer circuit for receiving the clock signal and outputting the clock signal;

a first transfer gate connected to an output terminal of the second buffer circuit, for outputting the clock signal supplied from the second buffer circuit as a second clock signal in response to the first signal supplied from the signal generating circuit;

a delay circuit connected to the output terminal of the second buffer circuit, for delaying the clock signal supplied from the second buffer circuit; and a second transfer gate connected to an output terminal of the delay circuit, for outputting the clock signal supplied from the delay circuit as the second clock signal in response to the second signal supplied from the signal generating circuit, wherein said delay circuit has a delay time corresponding to the difference between a cycle time of the first latency and a cycle time of the second latency.

3. A device according to claim 2, further comprising a transfer gate connected to the gate circuit, for controlling a timing of transferring an address signal in accordance with the first clock signal.

4. A device according to claim 2, further comprising a logic circuit for receiving at a first input terminal the first clock signal output from the gate circuit, and at a second input terminal the second signal representing the second latency, said logic circuit having an output terminal connected to the second transfer gate.

5. A device according to claim 2, wherein the first clock signal is supplied to a circuit constituting the first stage, and the second clock signal to a circuit constituting the second stage.

6. A device according to claim 2, wherein each of the first and second buffer circuits comprises:
- a differential amplifier having a first input terminal for receiving a reference voltage and a second input terminal for receiving the clock signal;
- a flip-flop circuit having first and second input terminals and an output terminal, said first input terminal connected to an output terminal of the differential amplifier; and
- a delay circuit connected between the output terminal and second input terminal of the flip-flop circuit and having a delay time equal to a difference between a cycle time of the first latency and a cycle of the second latency smaller than the first latency.

7. A semiconductor memory device having a data path divided into first, second and third stages, each having a pipeline structure and designed to operate in synchronism with a clock signal, said device comprising:
- a signal generating circuit for generating, in response to a command, a first signal representing a first latency and a second signal representing a second latency smaller than the first latency;
- a buffer circuit for receiving a clock signal;
- a flip-flop circuit connected to an output terminal of the buffer circuit, for holding a leading edge of the clock signal;
- a first delay circuit connected between first output terminal and second input terminal of the flip-flop circuit, having a delay time equal to a difference between a cycle time of the first latency and a cycle of the second latency smaller than the first latency, and designed to invert, in accordance with the delay time, a signal output from a second output terminal of the flip-flop circuit;
- a second delay circuit connected to the second output terminal of the flip-flop circuit, for delaying the signal output from the second output terminal of the flip-flop circuit, by a time nearly equal to a pulse width of the clock signal;
- a first transfer gate having an input terminal connected to the second output terminal of the flip-flop circuit, to be controlled by the second signal representing the second latency;
- a second transfer gate having an input terminal connected to an input terminal of the second delay circuit, to be controlled by the second signal representing the second latency; and
- a gate circuit having a first input terminal connected to an output terminal of the first transfer gate and a second input terminal connected to an output terminal of the second transfer gate, and designed to generate an internal clock signal delayed with respect to the clock signal and used to drive the second stage, in response to the second signal representing the second latency and in response to a signal output from the second output terminal of flip-flop circuit and supplied through the first transfer gate and a signal output from the second delay circuit and supplied through the second transfer gate.

8. A semiconductor memory device comprising:
- a pipeline structure having a path extending from an address input terminal to a data output terminal, divided into first, second and third stages in accordance with a clock cycle, each designed to operate in synchronism with a clock signal;
- a command decoder for receiving a plurality of signals and decoding the plurality of signals, thereby to generate a command;
- a signal generating circuit for generating a first signal representing a first latency and a second signal representing a second latency smaller than the first latency, in response to the command generated by the command decoder;
- a buffer circuit for receiving a clock signal;
- a first transfer gate connected to an output terminal of the buffer circuit, for outputting the clock signal output from the buffer circuit as an internal clock signal when turned on by the first signal representing the first latency;
- a delay circuit connected to the buffer circuit, having a delay time equal to a difference between a cycle time of the first latency and a cycle of the second latency smaller than the first latency, and designed to delay the clock signal output from the buffer circuit; and
- a second transfer gate connected to an output terminal of the delay circuit, for outputting the clock signal delayed by the delay circuit, as the internal clock signal, when turned on by the second signal representing the second latency.

* * * * *